(12) United States Patent
Liu et al.

(10) Patent No.: US 9,105,481 B2
(45) Date of Patent: Aug. 11, 2015

(54) SEMICONDUCTOR STRUCTURE

(71) Applicant: National Applied Research Laboratories, Taipei (TW)

(72) Inventors: Chee-Wee Liu, Hsinchu (TW); Yen-Ting Chen, Taipei (TW)

(73) Assignee: NATIONAL APPLIED RESEARCH LABORATORIES, Taipei (TW)

( * ) Notice: Subject to any disclaimer, the term of this patent is extended or adjusted under 35 U.S.C. 154(b) by 36 days.

(21) Appl. No.: 14/010,713

(22) Filed: Aug. 27, 2013

(65) Prior Publication Data
US 2014/0264439 A1 Sep. 18, 2014

(30) Foreign Application Priority Data

Mar. 18, 2013 (TW) .............................. 102109507 A

(51) Int. Cl.
| | | |
|---|---|---|
| H01L 29/04 | (2006.01) | |
| H01L 29/165 | (2006.01) | |
| H01L 29/66 | (2006.01) | |
| H01L 29/775 | (2006.01) | |
| H01L 29/06 | (2006.01) | |
| H01L 21/84 | (2006.01) | |
| H01L 29/423 | (2006.01) | |
| H01L 29/786 | (2006.01) | |

(52) U.S. Cl.
CPC .............. *H01L 29/045* (2013.01); *H01L 21/84* (2013.01); *H01L 29/0673* (2013.01); *H01L 29/165* (2013.01); *H01L 29/42392* (2013.01); *H01L 29/66439* (2013.01); *H01L 29/775* (2013.01); *H01L 29/78696* (2013.01)

(58) Field of Classification Search
CPC ..................... H01L 29/045; H01L 21/823807; H01L 33/16; H01L 33/32; H01L 27/1211
USPC .................................. 257/220, 320, 401, 628
See application file for complete search history.

(56) References Cited

U.S. PATENT DOCUMENTS

| | | | |
|---|---|---|---|
| 6,864,520 B2 * | 3/2005 | Fischetti et al. | ............... 257/255 |
| 8,242,568 B2 * | 8/2012 | Ikeda et al. | .................... 257/401 |
| 2003/0190791 A1 | 10/2003 | Fischetti et al. | |

OTHER PUBLICATIONS

Tsu-Jae King, "FinFETs for Nanoscale CMOS Digital Integrated Circuits", 2005, pp. 207-210, IEEE.
Yang, et al., Applied Physics Letters 91, 102103, "Electron mobility enhancement in strained-germanium n-channel metal-oxide-semiconductor field-effect transistors", 2007, American Institute of Physics.

* cited by examiner

*Primary Examiner* — Quoc Hoang
(74) *Attorney, Agent, or Firm* — WPAT, PC; Justin King

(57) ABSTRACT

A semiconductor structure is provided. The semiconductor structure includes a substrate, at least a first N-type germanium (Ge) structure and at least a first P-type Ge structure. The first N-type Ge structure is formed on the substrate and has two end parts and at least a first central part bonded between the two end parts thereof. The first central part is floated over the substrate, and a side surface of the first central part is a {111} Ge crystallographic surface. The first P-type Ge structure is formed on the substrate and has two end parts and at least a second central part bonded between the two end parts thereof. The side surface of the second central part is a {110} Ge crystallographic surface.

19 Claims, 4 Drawing Sheets

SEMICONDUCTOR STRUCTURE

FIELD OF THE INVENTION

The present invention relates to a semiconductor structure, and particularly to a semiconductor structure used in a germanium semiconductor component.

BACKGROUND OF THE INVENTION

For reducing the semiconductor component size and avoiding the short channel effects as well as increasing the response speed of the semiconductor component and reducing the power consumption in the nanometer generation semiconductor fabricating process, the use of a semiconductor material having high carrier mobility is a solution. For example, the use of germanium (Ge) to fabricate the fin-gate field-effect transistor. However, if two or more Ge three-dimensional semiconductor components having different carrier types are fabricated on the same wafer, it is quite necessary to consider how to choose the sidewall orientation for electron carrier and hole carrier to achieve high mobility and high performance in the Ge three-dimensional semiconductor component. Therefore, an object of the development of the present invention is to fabricate a semiconductor component capable of eliminating the above drawbacks and thereby meeting the requirements in the nanometer generation.

SUMMARY OF THE INVENTION

An aspect of the present invention provides a semiconductor structure, which includes a substrate, at least a first N-type germanium (Ge) structure (hereafter the structure may be referred to as a FET structure) and at least a first P-type Ge structure. The first N-type Ge structure is formed on the substrate and has two end parts and at least a first central part bonded between the two end parts thereof. The first central part is floated over the substrate, and a side surface of the first central part is a {111} Ge crystallographic surface. The majority carrier in the first N-type Ge structure is electron. The first P-type Ge structure is formed on the substrate and has two end parts and at least a second central part bonded between the two end parts thereof. The side surface of the second central part is a {110} Ge crystallographic surface. The majority carrier in the first P-type Ge structure is hole. Another aspect of the present invention provides a semiconductor structure, which includes a substrate, at least a first N-type Ge structure and at least a first P-type Ge structure. The N-type Ge structure includes a first source, a first channel and a first drain. The first source is bonded to a surface of the substrate. The first channel is bonded over the first source. A side surface of the first channel is a {111} Ge crystallographic surface. The first drain is bonded over the first channel. The P-type Ge structure includes a second drain, a second channel and a second source. The second drain is bonded over the first drain. The second channel is bonded over the second drain. A side surface of the second channel is a {110} Ge crystallographic surface. The second source is bonded over the second channel.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1A:
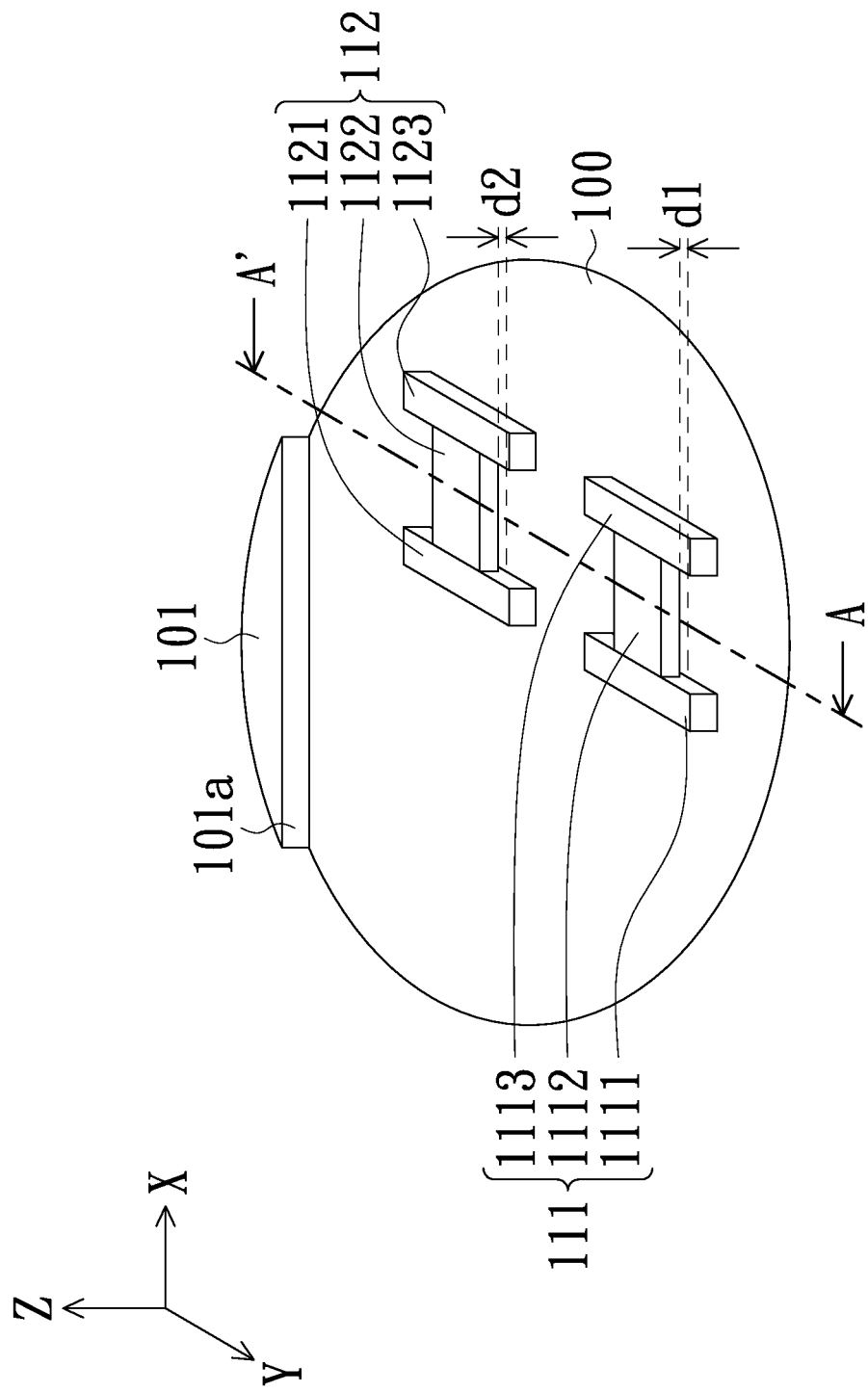
FIGS. 1A-1C are schematic three-dimensional and cross-sectional views illustrating a semiconductor structure in accordance with an embodiment of the present invention.
Figure 1B:
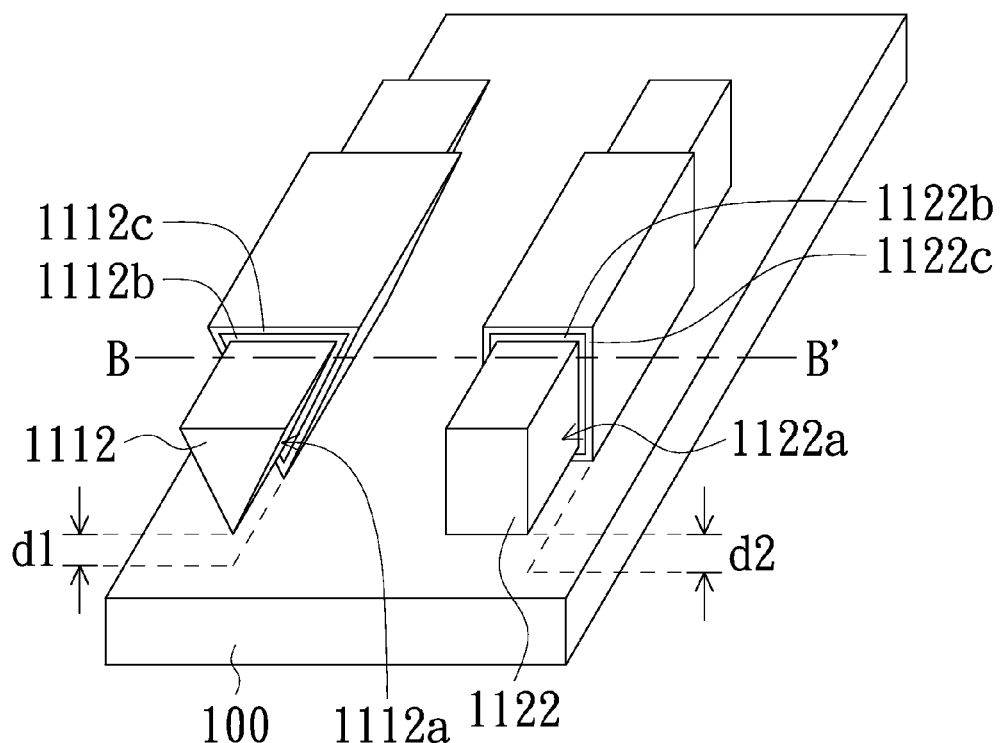
Figure 1C:
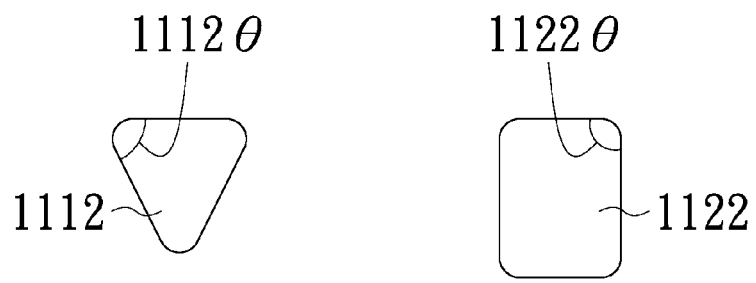
Figure 1C:

FIGS. 1A~1C are schematic three-dimensional and cross-sectional views of a semiconductor structure in accordance with an embodiment of the present invention. First, please refer to FIG. 1A, a substrate 100, such as bulk silicon (Si) substrate, a silicon-on-insulator (SOI) substrate or a substrate having a surface of insulating layer, is provided. In one embodiment, the substrate 100 may be a P-type extrinsic semiconductor substrate, an N-type extrinsic semiconductor substrate or an intrinsic semiconductor substrate; and the present invention is not limited thereto. In the present embodiment, one surface of the substrate 100 is a {100} Si crystallographic surface (as is indicated by the x-y plane), on which a germanium (Ge) layer 101 is grown. Accordingly, one surface of the Ge layer 101 is the {100} Si crystallographic surface. Next, an anisotropic etching process is performed on one specific surface (having a plane perpendicular or parallel to a cut plane 101a (as is indicated by the y-z or x-z plane)) of the {110} Ge crystallographic surface to form at least one first Ge structure in the Ge layer 101. In the present embodiment, the semiconductor structure is exemplified by including two first Ge structures 111, 112, as illustrated in FIGS. 1A-1C.

The Si and Ge materials have different lattice sizes and accordingly a defect region (not shown) may be formed near the interface between the substrate 100 and the Ge layer 101, Thus, by using the Ge crystal in the defect region has a material characteristic of being relatively easier to be removed due to the lower strength thereof, the central parts 1112, 1122 of the first Ge structures 111, 112 may be simultaneously formed to be bonded to the end parts 1111, 1113 and 1121, 1123 while the end parts 1111, 1113 and 1121, 1123 are being formed to be bonded to the substrate 100, respectively.

In the present embodiment, by adjusting some specific parameters in the anisotropic etching process, forming masks having various sizes or selectively forming a protective layer on the side surfaces of the central parts 1112, 1122 during the etching process, the vertical etching speed and the horizontal etching speed in the anisotropic etching process can be effectively controlled and thereby being able to float the bottoms of the central parts 1112, 1122 of the first Ge structures 111, 112 over the surface of the substrate 100. Specifically, the bottoms of the central parts 1112, 1122 and the surface of the substrate 100 are configured to have distances d1, d2 therebetween, respectively; wherein d1 may be equal or different to d2. Further, the central parts 1112, 1122 each may be etched to have a specific cross section by the aforementioned anisotropic etching process.

FIG. 1B is a schematic cross-sectional view illustrating the structure of FIG. 1A and taken along the line AA'.

Please refer to FIG. 1B. The central parts 1112, 1122 of the first Ge structures 111, 112 are etched to be floated over the substrate 100 and the cross sections thereof have an inverted triangle shape and a rectangle shape, respectively. Specifically, a side surface 1112a of the central part 1112 is a {111} crystallographic surface; and a side surface 1122a of the central part 1122 is a {110} crystallographic surface. Next, the central parts 1112, 1122 are covered by insulation structures 1112b, 1122b, respectively; wherein the insulation structure may be formed by sequentially performing a thermal oxidation method to form an oxide layer on a surface of the Ge structure, and then performing an atomic layer deposition method to deposit an insulating material to cover the oxide layer by the insulating material. Next, the insulation structures 1112b, 1122b are covered by conductive layers 1112c, 1122c, respectively. In the present embodiment, the central parts 1112, 1122 each are served as a channel of a related Ge three-dimensional semiconductor component; and the insulation structures 1112b, 1122b together with the conductive layers 1112c, 1122c each are served as a gate structure of a related Ge three-dimensional semiconductor component, respectively.

After the formation of the channel and the gate structure of the Ge three-dimensional semiconductor component is completed, the end parts 1111, 1113 of the first Ge structure 111 may be processed by an N-type ion implantation process, an in-situ doping chemical vapor deposition or epitary and thereby converting the first Ge structure 111 into an N-type Ge structure having majority carrier of electron. Based on the same manner, the end parts 1121, 1123 of the first Ge structure 112 may be performed by a P-type ion implantation process, an in-situ doping chemical vapor deposition or epitary and thereby converting the first Ge structure 112 into a P-type Ge structure having majority carrier of hole. Then, an active region of a complementary Ge MOSFET is fabricated by combining the N-type Ge structure and the P-type Ge structure together.

For an N-type MOSFET, the end parts 1111, 1113 both are N-type if the side surface 1112a is the {111} crystallographic surface; and for a P-type MOSFET, the end parts 1121, 1123 both are P-type if the side surface 1122a is the {110} crystallographic surface. However, it is to be noted that for a junctionless MOSFET, the end parts 1111, 1113 (or, the end parts 1121, 1123) both are N-type if the channel thereof is N-type; alternatively, the end parts 1111, 1113 (or, the end parts 1121, 1123) both are P-type if the channel thereof is P-type.

It is to be noted that a Ge three-dimensional MOSFET is configured to use the side surface of the Ge three-dimensional channel thereof to conduct the carrier current; wherein the electron carrier has the highest mobility in the Ge channel on the {111} crystallographic surface and the hole carrier has the highest mobility in the Ge channel on the {110} crystallographic surface. Specifically, to an N-type Ge gate-all-around MOSFET, the central part 1112 is served as a channel and the side surface 1112a thereof is the {111} crystallographic surface in the present embodiment; and to a P-type Ge gate-all-around MOSFET, the central part 1122 is served as a channel and the side surface 1122a thereof is the {110} crystallographic surface in the present embodiment. Therefore, compared with the fin-gate Ge MOSFET, the gate-all-around Ge CMOS, formed by the first Ge structures 111, 112, has an improved controlling ability on turning on/off the carrier conduction, a better subcritical electrical performance such as lower component power consumption, and a smaller semiconductor component size capable of meeting the design requirement in the nanometer generation.

It is to be noted that according to Miller Index, a {hkl} crystallographic surface refers to a set of all planes perpendicular to vectors (±h, ±k, ±1). For example, the {111} crystallographic surface refers to a set of all planes perpendicular to vectors (±1, ±1, ±1); and the {110} crystallographic surface refers to a set of all planes perpendicular to vectors (±1, ±1, 0). In a practical application of the present invention, the {111} crystallographic surface refers to a set of all planes perpendicular to vectors (±1, ±1, ±1) within ±10 degrees, and the {110} crystallographic surface refers to a set of all planes perpendicular to vectors (±1, ±1, 0) within ±10 degrees.

FIG. 1C is a schematic cross-sectional view illustrating the structure of FIG. 1B and taken along the line BB'.

Please refer to FIG. 1C. In an active region of a semiconductor component, it is understood that the carriers tend to concentrate in a region having specific shape (e.g., a sharp corner); and the carrier concentration may result in a leakage current and a lower threshold voltage. Thus, to avoid the aforementioned situation, a passivation process may be selectively performed on the central parts 1112, 1122 after being formed. The passivation process may be realized by a chemical solution having oxidizing power, such as sulfuric acid solution. Thus, by using the chemical solution having oxidizing power to modify the sharp corners of the central parts 1112, 1122, the central parts 1112, 1122 both may have at least one curving-shaped inner corner on the cross section thereof. In a consequence, the situation of the carrier concentrating in a sharp region is avoided.

Figure 2:
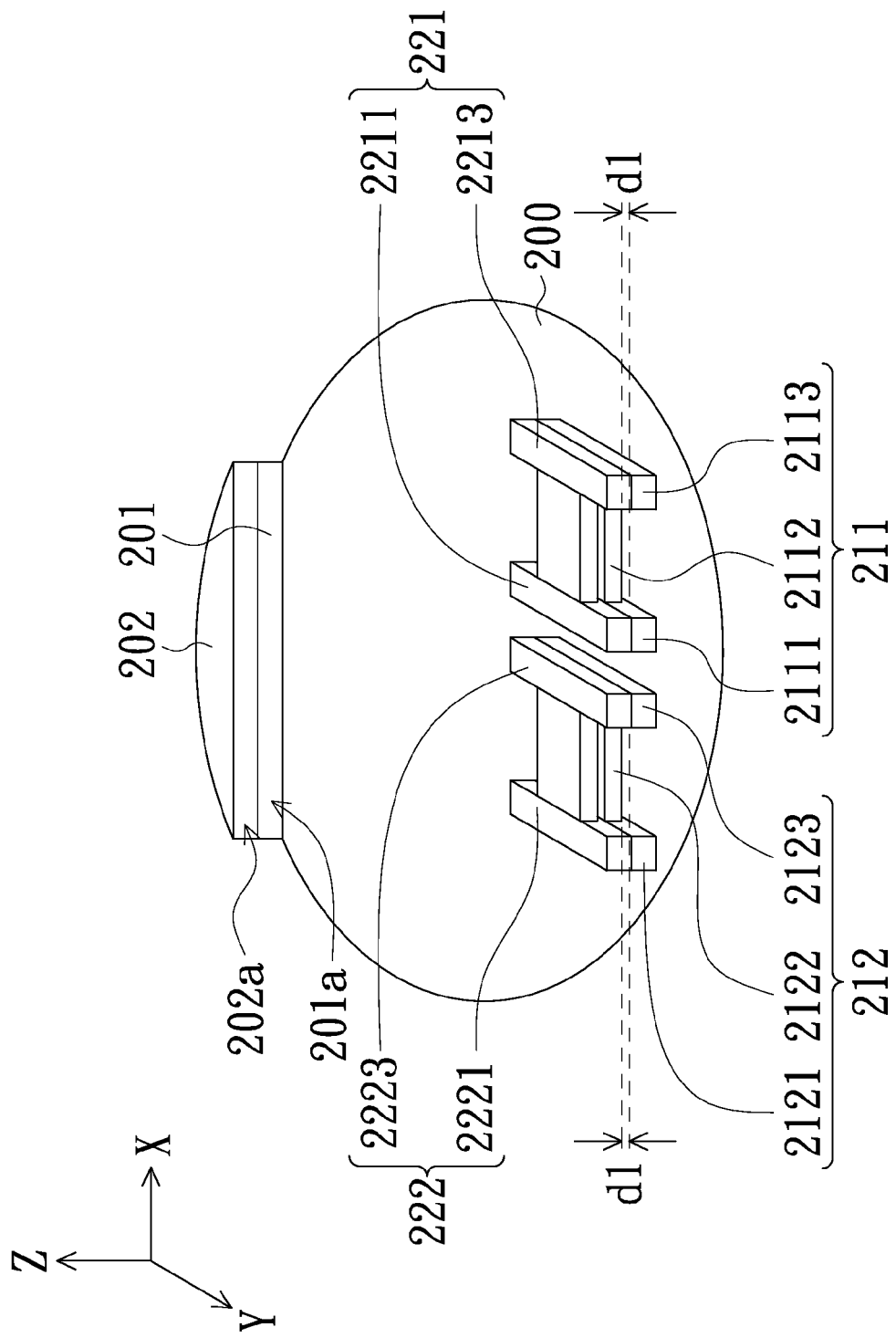
FIG. 2 is a schematic view illustrating an exemplary semiconductor structure having three-dimensional arrangement configuration.

FIG. 2 is a schematic view illustrating an exemplary semiconductor structure having three-dimensional arrangement structure in accordance with an embodiment of the present invention. As shown, first, a substrate 200 such as a bulk Si substrate, a SOI substrate or a substrate having a surface of insulation layer is provided. In one embodiment, the substrate 200 may be a P-type extrinsic semiconductor substrate, an N-type extrinsic semiconductor substrate or an intrinsic semiconductor substrate; and a surface of the substrate 100 is a {100} crystallographic surface (as is indicated by the x-y plane). According to the semiconductor structure disclosed in FIG. 1A, a Ge layer 201 is grown on a surface (the {100} crystallographic surface) of the substrate 200; and accordingly, one surface of the Ge layer 201 is also the {100} crystallographic surface. Next, an anisotropic etching process is performed on one specific surface (having a plane perpendicular or parallel to a cut plane 201a (as is indicated by the y-z or x-z plane)) of the Ge {110} crystallographic surface to form a plurality of first Ge structures in the Ge layer 201. In the present embodiment, the semiconductor structure is exemplified by including two first Ge structures 211, 212 as illustrated in FIG. 2. The end parts 2111, 2113 and 2121, 2123 of the first Ge structures 211, 212 are bonded to a surface of the substrate 200 and the central parts 2112, 2122 are floated over the surface of the substrate 200, respectively; wherein the central parts 2112, 2122 both have a distance d1 relative to the surface of the substrate 200. The central parts 2112, 2122 each have a cross section perpendicular to an axial direction (defined by the end parts 2111, 2113 and 2121, 2123 and as is indicated by the x-axis) thereof; and accordingly the cross section is floated over a surface of the substrate 200. Specifically, the cross section has a square or a rectangular shape; or, has a trapezoidal or an inverted triangle shape having a width gradually reduced from top to bottom.

Then, two second Ge structures 221, 222 are formed over the two first Ge structures 211, 212, respectively. In one embodiment, the formation of the second Ge structures 221, 222 may be realized by: forming the second Ge structures 221, 222 on a Ge layer 202 of another substrate; cutting, by the smart cut, the Ge layer 202 formed with the second Ge structures 221, 222 from the substrate; and bonding the cut Ge layer 202 formed with the second Ge structures 221, 222 to the substrate 200. In another embodiment, the formation of the second Ge structures 221, 222 may be realized by: forming, by the multi-film crystal growth technology, specific structures, such as a Ge layer, an isolation layer and the conductive holes for the conduction of carrier currents, over the first Ge structures 211, 212; and etching the Ge layer 202 to form the second Ge structures 221,222.

The end parts 2211,2213 and 2221,2223 of the second Ge structures 221, 222 are bonded to the end parts 2111,2113 and 2121,2123 of the first Ge structures 211, 212, respectively. In the present embodiment, the MOSFETs fabricated by the first Ge structures 211, 212 in the Ge layer 201 may have a structure having a combination of an N-type structure and a P-type structure, two N-type structures, or two P-type structures. Similarly, the MOSFETs fabricated by the second Ge structures 221, 222 in the Ge layer 202 may have a structure having a combination of an N-type structure and a P-type structure, two N-type structures, or two P-type structures.

By connecting the first Ge structure and the second Ge structure, a gate-all-around Ge CMOS having three-dimensional arrangement structure is formed. Specifically, it is understood that the gate-all-around Ge CMOS may have a configuration of: an N-type first Ge structure and an N-type second Ge structure; a P-type first Ge structure and a P-type second Ge structures; an N-type first Ge structure and a P-type second Ge structure; or a P-type first Ge structure and an N-type second Ge structure; and the present invention is not limited thereto. Thus, a semiconductor component having the aforementioned semiconductor structure can have an increased integrated density.

Figure 3:
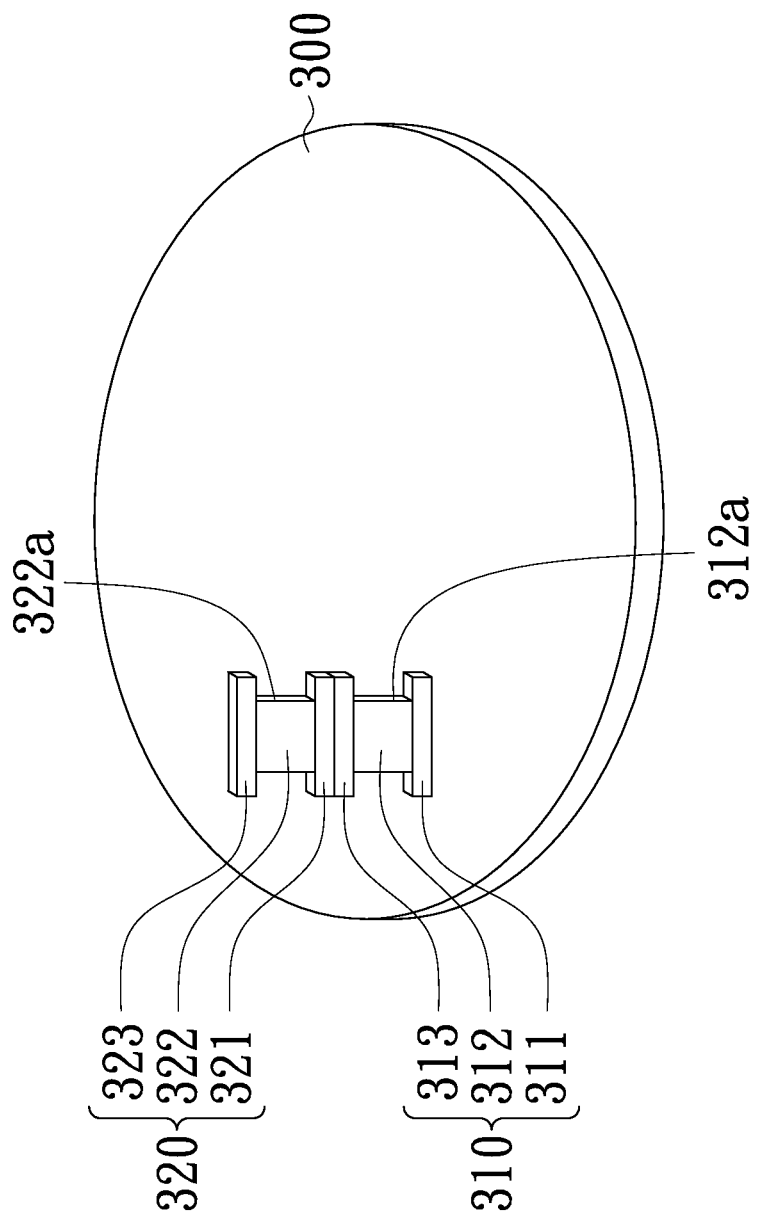
FIG. 3 is a schematic view illustrating another exemplary semiconductor structure having three-dimensional arrangement configuration.

FIG. 3 is a schematic view illustrating another exemplary semiconductor structure having three-dimensional arrangement structure in accordance with an embodiment of the present invention.

Please refer to FIG. 3. First, a substrate 300 is provided. The substrate 300 may be a P-type substrate or an N-type substrate; and the present embodiment is not limited thereto. Then, an N-type Ge structure 310 is formed on the substrate 300. In one embodiment, the formation of the N-type Ge structure 310 may be realized by: forming, by the multi-film crystal growth technology, a plurality of Ge layers on a Si substrate or a Ge substrate; and sequentially etching each of the Ge layer to form the N-type Ge structure. The N-type Ge structure 310 includes a source 311, a channel 312 and a drain 313. Specifically, the source 311 is bonded to a surface of the substrate 300; the channel 312 is bonded over the source 311; and a side surface 312a of the channel 312 is a {111} Ge crystallographic surface. In addition, by sequentially forming an isolation layer, a gate dielectric layer, a gate, and conductive holes for the conduction of carrier current while forming the source 311, the channel 312 and the drain 313 on the substrate 300, an N-type Ge semiconductor element is fabricated.

Next, a P-type Ge structure 320 is formed on the N-type Ge structure 310. In one embodiment, the formation of the P-type Ge structure 320 may be realized by: forming, by the multi-film crystal growth technology, a plurality of Ge layers on the N-type structure; and sequentially etching each of the Ge layer to form the P-type Ge structure. The P-type Ge structure 320 includes a drain 321, a channel 322 and a source 323. Specifically, the drain 321 is bonded to the drain 313 of the N-type Ge structure 310; the channel 322 is bonded over the drain 321; a side surface 322a of the channel 322 is a {110} Ge crystallographic surface; and the source 323 is bonded to the channel 322. In addition, by sequentially forming an isolation layer, a gate dielectric layer, a gate, and conductive holes for the conduction of carrier current while forming the drain 321, the channel 322 and the source 323, a P-type Ge semiconductor element is fabricated. The semiconductor structure of stacking a P-type Ge structure on an N-type Ge structure disclosed in this embodiment may be applied to the fabrication of a gate-all-around Ge CMOS; accordingly, the gate-all-around Ge CMOS has an improved semiconductor electrical performance and a higher semiconductor element integrated density.

In summary, by combining an N-type Ge structure having a side surface of a central part thereof being a {111} crystallographic surface and a P-type Ge structure having a side surface of a central part thereof being a {110} crystallographic surface, the semiconductor structure disclosed in the present invention has an enhanced electron and hole carrier mobility. Accordingly, the gate-all-around Ge CMOS having the aforementioned semiconductor structure also has an enhanced electron and hole carrier mobility so as to meet the design requirements of the nanometer-generation semiconductor component.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A semiconductor structure, comprising:
a substrate;
at least a first N-type germanium structure formed on the substrate, wherein the first N-type germanium structure comprises two end parts and at least a first central part bonded between the two end parts thereof, the first central part is floated over the substrate and has a distance to the substrate with respective to the two end parts, and a side surface of the first central part is a {111} germanium crystallographic surface; and
at least a first P-type germanium structure formed on the substrate, wherein the first P-type germanium structure comprises two end parts and at least a second central part bonded between the two end parts thereof, and a side surface of the second central part is a {110} germanium crystallographic surface.

2. The semiconductor structure according to claim 1, wherein the {111} crystallographic surface refers to a set of all planes perpendicular to vectors (±1, ±1, ±1) within ±10 degrees, and the {110} crystallographic surface refers to a set of all planes perpendicular to vectors (±1, ±1, 0) within ±10 degrees.

3. The semiconductor structure according to claim 1, wherein a cross section of the first central part is perpendicular to an axial direction thereof bonded between the two end parts of the first N-type germanium structure, wherein the cross section has a width in parallel with a surface of the substrate, and the width is gradually reduced from a top to a bottom of the cross section.

4. The semiconductor structure according to claim 3, wherein at least an inner corner of the cross section is a curving shape.

5. The semiconductor structure according to claim 1, wherein a surface of the substrate is a {100} silicon crystallographic surface, and the second central part is floated over the substrate.

6. The semiconductor structure according to claim 1, wherein a cross section of the second central part is perpendicular to an axial direction thereof bonded between the two end parts of the first P-type germanium structure, and the cross section has an inner corner ranged within 80~100 degrees.

7. The semiconductor structure according to claim 1, wherein the two end parts of the first N-type germanium structure and the two end parts of the first P-type germanium structure are bonded to the substrate.

8. The semiconductor structure according to claim 1, wherein the two end parts of the first N-type germanium structure are bonded to the substrate, and the two end parts of the first P-type germanium structure are bonded over the two end parts of the first N-type germanium structure, respectively.

9. The semiconductor structure according to claim 1, wherein the two end parts of the first P-type germanium structure are bonded to the substrate, and the two end parts of the first N-type germanium structure are bonded over the two end parts of the first P-type germanium structure, respectively.

10. The semiconductor structure according to claim 1, further comprising:
    at least a second N-type germanium structure formed on the first N-type germanium structure; and
    at least a second P-type germanium structure formed on the first P-type germanium structure.

11. The semiconductor structure according to claim 1, further comprising:
    an insulation structure covering the first central part and the second central part; and
    a conductive layer covering the insulation structure, wherein the insulation structure and the conductive layer corporately form a gate structure.

12. A semiconductor structure, comprising:
    a substrate;
    at least an N-type germanium structure comprising a first source, a first channel and a first drain, wherein the first source is bonded to a surface of the substrate, the first channel is bonded over the first source, a side surface of the first channel is a {111} germanium crystallographic surface, and the first drain is bonded over the first channel; and
    at least a P-type germanium structure comprising a second drain, a second channel and a second source, wherein the second drain is bonded over the first drain, the second channel is bonded over the second drain, a side surface of the second channel is a {110} germanium crystallographic surface, and the second source is bonded over the second channel.

13. The semiconductor structure according to claim 12, wherein the {111} germanium crystallographic surface refers to a set of all planes perpendicular to vectors (±1, ±1, ±1) within ±10 degrees, and the {110} germanium crystallographic surface refers to a set of all planes perpendicular to vectors (±1, ±1, 0) within ±10 degrees.

14. The semiconductor structure according to claim 12, wherein a cross section of the first channel is perpendicular to an axial direction of the first source and the first drain, wherein a cross section of the second channel is perpendicular to an axial direction of the second source and the second drain.

15. The semiconductor structure according to claim 12, further comprising:
    an insulation structure covering the first channel and the second channel; and
    a conductive layer covering the insulation structure, wherein the insulation structure and the conductive layer corporately form a gate structure.

16. A semiconductor structure, comprising:
    a substrate;
    at least an P-type germanium structure comprising a first source, a first channel and a first drain, wherein the first source is bonded to a surface of the substrate, the first channel is bonded over the first source, a side surface of the first channel is a {111} germanium crystallographic surface, and the first drain is bonded over the first channel; and
    at least a N-type germanium structure comprising a second drain, a second channel and a second source, wherein the second drain is bonded over the first drain, the second channel is bonded over the second drain, a side surface of the second channel is a {110} germanium crystallographic surface, and the second source is bonded over the second channel.

17. The semiconductor structure according to claim 16, wherein the {111} germanium crystallographic surface refers to a set of all planes perpendicular to vectors (±1, ±1, ±1) within ±10 degrees, and the {110} germanium crystallographic surface refers to a set of all planes perpendicular to vectors (±1, ±1, 0) within ±10 degrees.

18. The semiconductor structure according to claim 16, wherein a cross section of the first channel is perpendicular to an axial direction of the first source and the first drain, wherein a cross section of the second channel is perpendicular to an axial direction of the second source and the second drain.

19. The semiconductor structure according to claim 16, further comprising:
    an insulation structure covering the first channel and the second channel; and
    a conductive layer covering the insulation structure, wherein the insulation structure and the conductive layer corporately form a gate structure.

* * * * *